United States Patent
Ochiai et al.

(10) Patent No.: US 6,724,072 B2
(45) Date of Patent: Apr. 20, 2004

(54) LEAD FRAME, RESIN SEALING MOLD AND METHOD FOR MANUFACTURING A SEMICONDUCTOR DEVICE USING THE SAME

(75) Inventors: Isao Ochiai, Ota (JP); Kazumi Onda, hanyu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/291,815

(22) Filed: Nov. 12, 2002

(65) Prior Publication Data
US 2003/0090877 A1 May 15, 2003

(30) Foreign Application Priority Data

Nov. 12, 2001 (JP) .......................... 2001-346408
Jan. 29, 2002 (JP) .......................... 2002-020296

(51) Int. Cl.[7] .......................................... H01L 23/495
(52) U.S. Cl. .................. 257/667; 438/123; 438/124; 264/272.11; 264/272.17
(58) Field of Search ............... 257/666, 667, 257/670, 676; 438/123, 124; 264/272.11, 272.17

(56) References Cited

U.S. PATENT DOCUMENTS

| | | | | |
|---|---|---|---|---|
| 5,293,065 A | * | 3/1994 | Chan | 257/667 |
| 6,309,575 B1 | * | 10/2001 | Boutin et al. | 264/161 |
| 6,424,023 B1 | * | 7/2002 | Kim et al. | 257/666 |
| 2003/0087478 A1 | * | 5/2003 | Kasuga et al. | 438/112 |

FOREIGN PATENT DOCUMENTS

| | | | |
|---|---|---|---|
| JP | 08-181160 | | 7/1996 |
| JP | 410125706 | * | 5/1998 |
| JP | 410217286 | * | 8/1998 |
| JP | 411220087 | * | 8/1999 |

* cited by examiner

Primary Examiner—David A. Zarneke
(74) Attorney, Agent, or Firm—Rothwell, Figg, Ernst & Manbeck

(57) ABSTRACT

The preferred embodiments provide a lead frame wherein a first air vent 29 and a second air vent 30 are formed in an air vent forming region 32. When resin-molding, one end of this first air vent 29 is disposed within the cavity, whereby air in the cavity when resin-molding can be completely released to the outside of the cavity. As a result, a package after resin-molding includes no unfilled regions or voids, whereby a semiconductor device with excellent product quality can be provided. In the background, air in cavities could not be completely released when resin-molding since, for instance, one air vent was provided at a position apart from the cavity region, and unfilled regions or voids were created.

21 Claims, 15 Drawing Sheets

LEAD FRAME, RESIN SEALING MOLD AND METHOD FOR MANUFACTURING A SEMICONDUCTOR DEVICE USING THE SAME

BACKGROUND OF THE INVENTION

Priority is claimed to Japanese Patent Application Serial Number 2001-346408, filed on Nov. 12, 2001 and Japanese Patent Application Serial Number 2002-020296, filed on Jan. 29, 2002, the disclosures of which are incorporated herein by reference in their entireties.

1. Field of the Invention

The preferred embodiments of present invention relate to, among other things, a lead frame and a resin sealing mold which improve the productivity and quality of a semiconductor device formed by resin sealing, and a method for manufacturing a semiconductor device using the same.

2. Description of the Related Art

The following description sets forth the inventors' knowledge of related art and problems therein and should not be construed as an admission of knowledge in the prior art. Semiconductor devices have increased in capacity year after year. In accordance with this increase, the number of lead terminals that become various signal lines has tended to increase. In accordance with this tendency, a QFP (Quad Flat Package) type semiconductor device in which lead terminals extend outward from four directions has begun to be used. An example of this is disclosed in, for example, Japanese Unexamined Patent Publication No. H08-181160.

Hereinafter, background examples will be described with reference to the accompanying drawings. In this regard, FIG. 16 is a plan view of a lead frame, FIG. 17 is a perspective view of a mold, and FIG. 18 is a plan view of a lead frame after resin sealing.

A lead frame 1 shown in FIG. 16 can be formed by means of press-working or etching, and herein, six units are provided and semiconductor elements are mounted on the respective units. Each unit has a roughly square stage (island) 2 for mounting a semiconductor element and lead terminals extending in four directions outward around the stage 2. Furthermore, considering a mold, each unit has gates 4 as resin passages at the corners of a sealing region, and holes 5 for air vents when resin-sealing.

A mold 6 adapted to this lead frame 1 includes, as shown in FIG. 17, an upper mold 7 and a lower mold 8. The upper mold 7 and the lower mold 8 have a plurality of cavities 9 which face the stage 2 of the lead frame, pots 10 that are resin injection ports, and runners 11 which connect the cavities 9 and the pots 10 and serve as flow passages for filling the insides of the cavities 9 with a resin.

In this example, one pot 10 is provided for four cavities, and the runners 11 radially extend toward the respective cavities from the pots. The pots 10' of the upper mold penetrate for injecting a resin from the upper side. Furthermore, cavities are also formed in the upper mold 7 although they are hidden in FIG. 17.

Next, a method for manufacturing a semiconductor device will be described. First, semiconductor elements are mounted on the stages 2 of the lead frame 1 shown in FIG. 16 via a silver paste that is an adhesive agent. The semiconductor element has a plurality of electrodes on the surface (not shown), and is mounted and fixed on the stage. Thereafter, the electrodes and lead terminals 3 are electrically connected by means of wire-bonding.

After thus mounting the semiconductor elements, the lead frame 1 is set between the upper mold 7 and the lower mold 8 shown in FIG. 17. Then, cavities as injection regions are formed by closing the molds.

Next, a resin to be melted is injected from the pots 10' of the upper mold 7 at a predetermined pressure. The resin flows into the cavities of the upper mold 7 and the lower mold 7 and is filled in the cavities 9 via the runners 11. Then, the semiconductor elements are sealed. Before injecting the resin, air exists inside the cavities 9. However, at the stage of entry of the resin into the cavities, the resin presses the air and the air is released to, for example, air vents made in the upper mold 7. The air vents are formed as gaps that do not allow penetration of the resin.

After the resin is cooled and cured after being filled, the lead frame 1 is released by opening the molds. FIG. 18 shows the lead frame at this point. In this figure, for easy understanding of the resin flows, portions at which the pots and runners had existed when resin-sealing are shown by dashed lines. As clearly understood from FIG. 18, the resin flows in from the pot 10 that is positioned at the center of four sealing regions through the gates 4. Thereby, the semiconductor elements to be mounted on the stage and a part of the lead terminals 3 around the semiconductor elements are covered by the resin to form one package 12.

Subsequently, the connecting portions of the lead terminals 3 are cut, and the separated lead terminals 3 are bent, whereby a QFP type semiconductor device is completed.

As mentioned above, in the background method for manufacturing a semiconductor device, as shown in FIG. 17, air in the cavities 9 is led to the ends of the cavities 9 and then released to the outside from the cavities 9 through the air vents made in the mold. However, when the air is pressed out from the air vents, the resin forms burrs between the lead frame 1 and the upper mold 7 or between the lead frame 1 and the lower mold 8. The thickness of the resin burrs can be as thin as about 30 μm. In some cases, when releasing the package 12 from the mold 6, the resin burrs are not released from the mold together with the package 12 and remain inside the mold. These remaining resin burrs can obstruct the paths for releasing the air inside the cavities during the next time of resin molding. As a result, the air cannot be released to the outside, and the air is compressed and remains inside the cavities 9. This is problematic because voids and unfilled regions are created in the package.

On the other hand, an air vent provided at the mold side has been considered. At a portion corresponding to the air vent, a part 13 of the lead frame exists, which is originally set so as not to be a lead terminal. On this part, resin burrs of about 30 μm are created as in the above-mentioned case. In some cases, the burrs are left on the lead material during mold-release. In such cases, in the next process of lead bending, the resin burrs remaining on the lead frame 13 are crushed and remain on the bending mold. Since the burrs remain on the mold, in the next bending process this bending mold causes defects such as dents on the lead and lead deformation due to the crushed burrs.

In the case of a QFN (Quad Flat Non-leaded Package) type semiconductor device, the back surface can serve as a mounting surface, and the leads exposed to the back surface make electrical connection with a conductive pattern on a mounting substrate. However, in the background manufacturing method, resin burrs are created on at least the lead frame 13 including continuous packages. Therefore, when mounting the above-mentioned semiconductor device on the mounting substrate, mounting failures may occur due to resin burrs created at the package end.

There is a need in the art for improved systems and methods that overcome the above and/or other problems.

SUMMARY OF THE PREFERRED EMBODIMENTS

The various preferred embodiments of the present invention significantly improve upon existing systems and methods.

In some preferred embodiments, a lead frame can include, e.g.: at least one island; a pair of first connected line bodies and a pair of second connected line bodies which are disposed so as to surround the island; a plurality of leads extending from the first and second connected line bodies to the vicinity of the island; tie bars which integrate the leads and are disposed so as to surround the island; and air vent disposing regions formed in the vicinities of regions in which the first and second connected line bodies intersect; wherein at least in a first of the air vent disposing regions, a first air vent penetrating a lead forming region between the first air vent disposing region and the island and a second air vent that is formed independently in the vicinity of this first air vent are provided.

Furthermore, in the lead frame, preferably, the first air vent disposing region is formed integrally with two of the tie bars in the vicinity of an intersection of these two tie bars.

Furthermore, in some preferred embodiments, a resin sealing mold assembly can be provided having an upper mold and a lower mold which includes: a substantially hexahedral cavity for housing at least a lead frame and a semiconductor element; and at least one air releasing groove at contact surfaces of at least the upper mold or lower mold from at least one corner of the hexahedral cavity.

Furthermore, preferably, first air vents and second air vents that are independent from each other are formed in the lead frame to be pressed by the upper mold and the lower mold at a plurality of corners, and a resin injection gate is formed at least at one of the corners, one end of the resin injection gate positioned at a cavity side is formed at the contact surfaces proximate the cavity region, and the one end of the resin injection gate and the first air vent are continued to each other.

Furthermore, in some preferred embodiments, a method for manufacturing a semiconductor device can include: preparing a lead frame having at least tie bars for integrally supporting a plurality of leads and first air vents and second air vents, and on which semiconductor elements are mounted; housing the lead frame in a resin sealing mold that includes an upper mold and a lower mold and has a substantially hexahedral cavity and four corners of the hexahedron formed at a surface of contact between the upper mold and lower mold via the lead frame, and air releasing grooves at the contact surfaces of at least the upper mold or lower mold from a plurality of the corners; and leading air in the cavity through the first air vents, the air releasing grooves and the second air vents, and filling a resin in the cavity, whereby a resin sealed body is formed.

Furthermore, preferably, after releasing the lead frame from the mold, at least the resin in the first air vents remains in the first air vents, and in the tie bar cutting process, the first and second air vents are simultaneously eliminated.

First, in the lead frame of the preferred embodiments, first and second air vents can be formed independently from each other in an air vent forming region near the intersection of the first connected line body and the second connected line body. The lead frame can include that one end of the first air vent is continued to the cavity when resin-molding. Thereby, air existing in the cavity can reliably flow out to the outside of the cavity through the first air vent. As a result, substantially no air remains in the cavities and the resin can be filled in substantially the entire cavity, whereby a lead frame can be realized by which a package without unfilled regions can be formed.

Second, in the lead frame of the preferred embodiments, the first and second air vents can have a thickness almost equivalent to that of the lead frame. When resin-molding, air existing in the cavity is released, and at the same time, the resin also flows out. However, this resin can be securely contained inside the first and second air vents and the air releasing groove. Accordingly, the resin that has flown out can be cured and can become resin burrs outside the package. However, such resin burrs can be integrated with the lead frame via the first and second air vents and the air releasing groove. Accordingly, in a preferred semiconductor device manufacturing process, a lead frame can be realized which avoids disadvantages in which resin burrs are created and crushed to deteriorate the product quality or remain inside the mold during mold-release.

Third, the lead frame can include that the first and second air vents can be formed independently from each other, and the first air vent can be formed outward from the package forming region, and at the tip end side thereof, the second air vent can be formed. Thereby, the air existing in the cavity can be led to the outside of the package as much as possible. As a result, a lead frame can be realized in which, even when a connecting portion between the first air vent and the second air vent is closed by a resin, the air can be reliably released to the outside of the cavity.

Fourth, a resin sealing mold in some embodiments can include that an air releasing groove for connecting the first and second air vents formed in the above-mentioned lead frame can be formed at a position apart from the cavity end. This can avoid creation of thin resin burrs on the package outside surface. The resin cured in the air releasing groove can be handled integrally with the resin cured in the first and second air vents. Accordingly, when releasing the package from the mold, one can avoid having resin burrs crushed and remaining inside the mold, whereby a resin sealing mold can be realized which avoids deteriorating the product quality.

Fifth, the resin sealing mold can include that the tip end of a resin injection gate can be positioned at the contact surfaces of the upper mold and the lower mold apart from the cavity. Namely, also at the gate, a structure for injecting a resin by using the above-mentioned first air vent can be provided. Thereby, one can avoid having thin resin burrs created on the package outside surface. Accordingly, a resin sealing mold can be realized which suppresses mounting failures of, particularly, a leadless type semiconductor device.

Sixth, the semiconductor device manufacturing method can include that resin-molding is carried out by using the above-mentioned lead frame and resin sealing mold. Thereby, resin burrs outside the package and the lead frame can be integrally handled, so that the tie bar cutting process and the process of cutting the first and second air vent forming regions can be simultaneously carried out. Accordingly, at the point of the next lead bending process, all resin burrs outside the package can have been removed, dents or molding failures due to resin burrs crushed in the lead bending process can be inhibited from occurring in the leads.

Seventh, the semiconductor device manufacturing method can include that, as described in the fifth effect, the tie bar cutting process and the air vent cutting process can be simultaneously carried out. Thereby, the lead bending process that is a post-process can be continuously carried out. Accordingly, work time and capital investment can be reduced.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims

BRIEF DESCRIPTION OF THE DRAWINGS

The accompanying figures are provided by way of example, without limiting the broad scope of the invention or various other embodiments, wherein.

DETAILED DESCRIPTION OF THE PREFERRED EMBODIMENTS

Hereinafter, a lead frame, a resin sealing mold, and a method for manufacturing a semiconductor device using the same according to some preferred embodiments of the invention is described in detail with reference to FIGS. 1–15(B).

Figure 1:
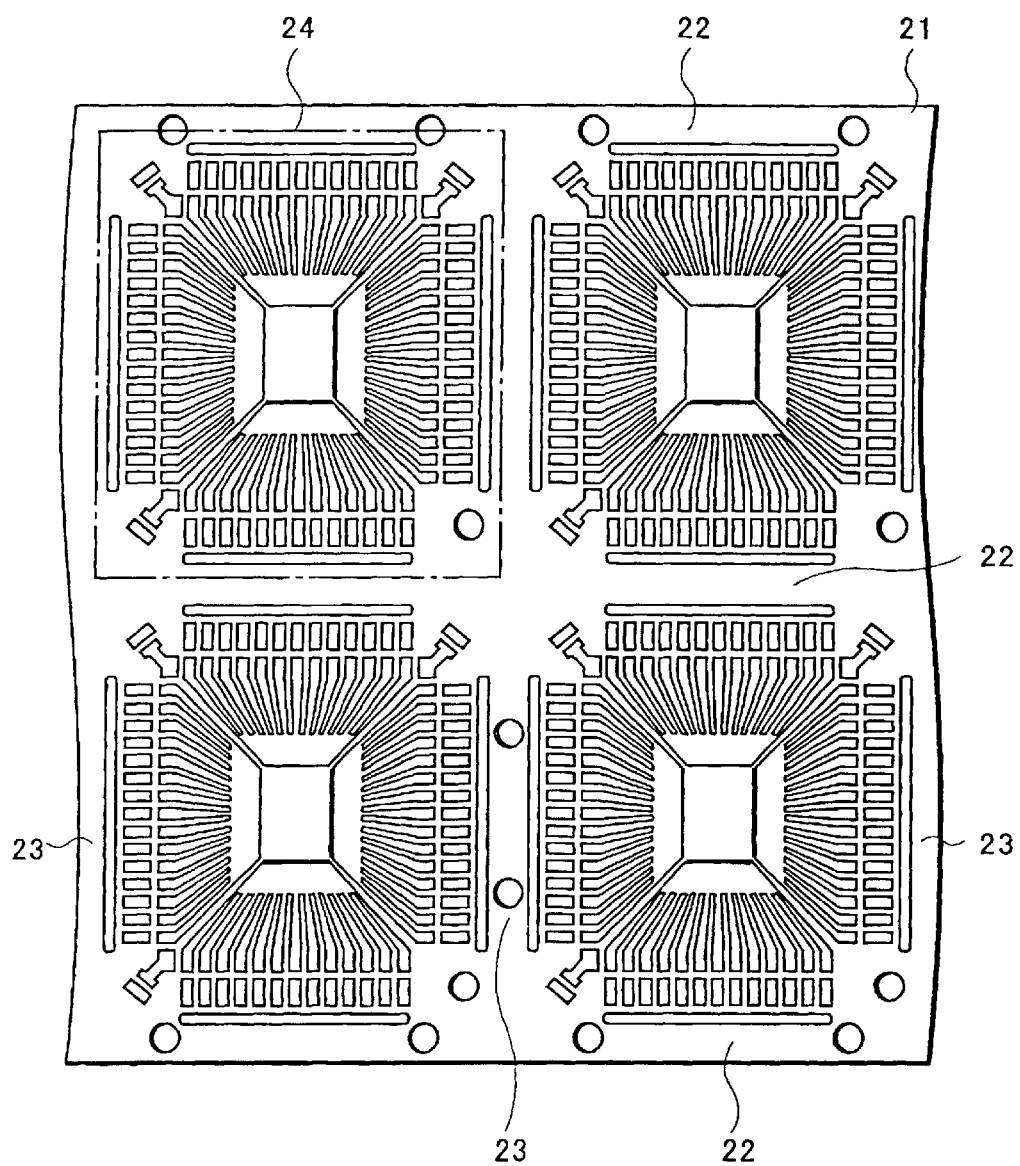
FIG. 1 is a plan view describing a lead frame according to some embodiments of the invention.
Figure 2:
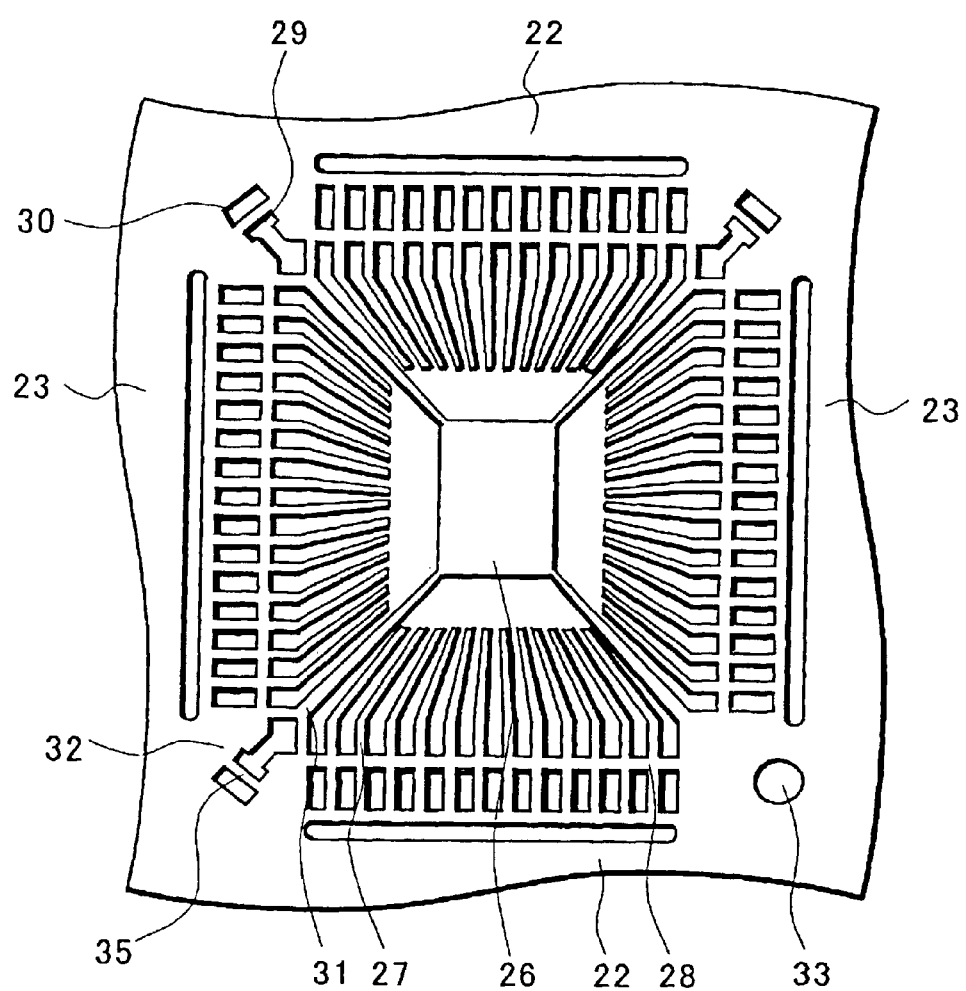
FIG. 2 is a plan view describing the lead frame according to some embodiments of the invention.
Figure 3A:
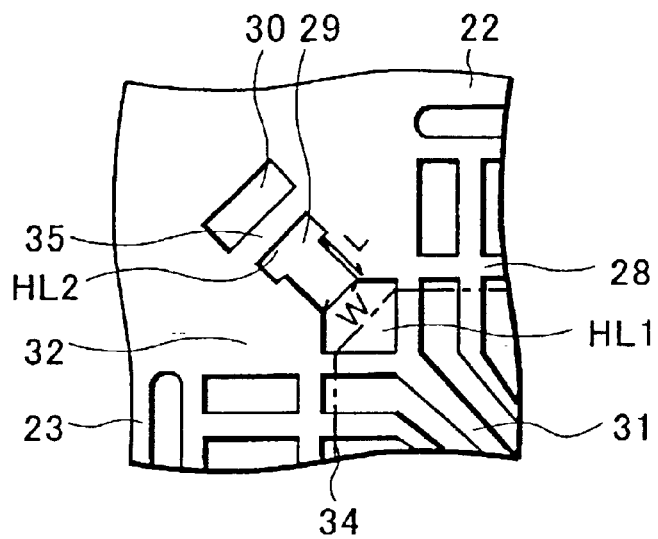
FIGS. 3(A)–3(C) are plan views describing the lead frame according to some embodiments of the invention.
Figure 3B:
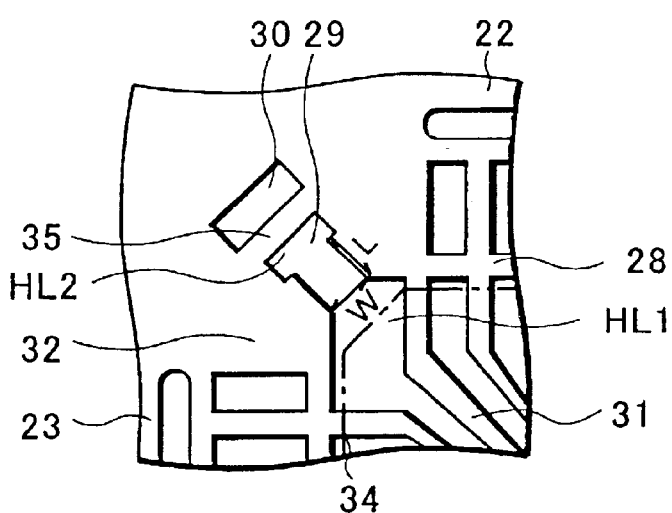
Figure 3C:
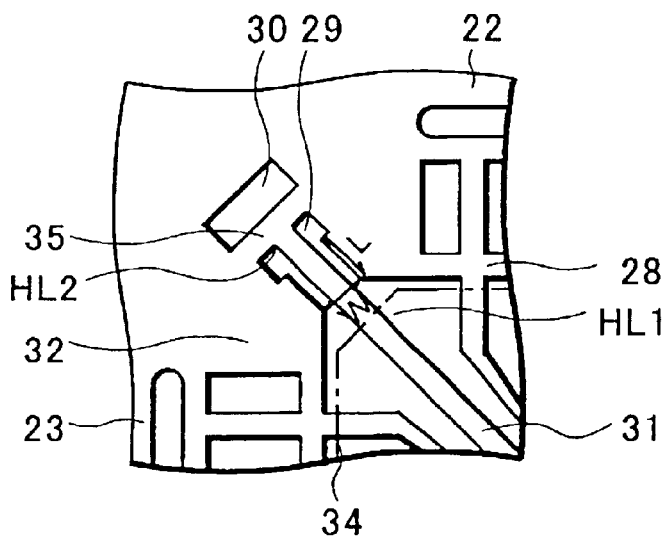

First, with reference to FIGS. 1–3(C), the lead frame will be described. FIG. 1 is a plan view of the lead frame of an embodiment of the invention. FIG. 2 is a plan view showing an enlarged condition of one unit of the lead frame of FIG. 1. FIGS. 3(A)–3(C) show enlarged views of portions of the lead frame.

As shown in FIG. 1, a plurality of mounting portions 24 showing units each of which corresponds to one semiconductor device shown by an alternate long and short dashed lines are formed on the lead frame 21. In FIG. 1, only four mounting portions 24 are shown. However, it is only required that at least one mounting portion is disposed. This mounting portion 24 can be surrounded by a pair of connected line bodies 22 extending in the transverse direction with respect to the page surface and a pair of second connected line bodies 23 extending in the lengthwise direction with respect to the paper surface. By these first and second connected line bodies 22 and 23, a plurality of mounting portions 24 can be disposed on one lead frame 21. The lead frame 21 can be formed of a frame mainly made from, for example, copper with a thickness of approximately 100 to 250 $\mu$m. However, this material can be or can include Fe—Ni or other metal materials.

As shown in FIG. 2, one mounting portion 24 can include an island 26, suspending leads 31 for supporting the island 26, a plurality of leads 27 which can be positioned near the four sides of the island 26 and extended toward the first and second connected line bodies 22 and 23 so as to surround the four sides, and first and second air vents 30. The air vents 30 can be provided in regions 32, each of which can be positioned at an extension of the suspending lead 31 and surrounded by the bifurcated lead 31 and the first and second connected line bodies 22 and 23, or the regions 32 can be surrounded by two leads 27 at both ends of the suspending lead 31 and the first and second connected line bodies 22 and 23. In the illustrated embodiment, a first air vent 29 and a second air vent 30 can be formed in the respective three air vent forming regions 32. However, in various embodiments, the first and second air vents need only be provided in one or more regions. Furthermore, at least one resin injection port is required. In an illustrative embodiment, a resin injection port is provided at the lower right corner shown by the circle mark 33, and no air vent is provided at this corner. In some instances, it is not always required that a resin injection port is provided at the four corners. For instance, in some cases, a first air vent 29 and a second air vent 30 can be respectively formed in all air vent forming regions 32 at the four corners.

In FIGS. 3(A)–3(C), two air vents 29 and 30 are shown in enlarged views. FIG. 3(A) shows a case where a suspending lead 31 is formed at both sides of the first air vent 29. FIG. 3(B) shows a case where a suspending lead 31 is formed at only one side of the first air vent 29. FIG. 3(C) shows a case where a suspending lead 31 is formed in the first air vent 29. In the air vent forming region 32, the first air vent 29 and the second air vent 30 are preferably formed as holes that are independent from each other. The line 34 shown by the alternate long and short two-dashed lines illustrates an outer line of a resin package. As shown, a part of the first air vent 29 is included in this package. Namely, two first and second air vents 29 and 30 can be formed in an air vent forming region 32, and the first air vent 29 is preferably continued to the cavity 46 (see FIG. 4). In the illustrated embodiment, two holes formed in the air vent forming region of the lead frame comprise a first air vent 29 and a second air vent 30, respectively.

For example, a first air vent can be shaped into a generally "T"-shape so that one end thereof is included in the cavity 46. At the portion of the cavity 46 at which the first air vent 29 is formed, a hole (e.g., gap) for releasing air and resin existing in the cavity 46 can be disposed. As shown in FIG. 4(B), this hole can correspond to the portion 29A shown at the tips of the two arrows shown at the left side. Since the thickness of the lead frame 21 can be approximately 100 to 250 μm, this hole 29A can open vertically by a degree corresponding to about the thickness of the lead frame 21. On the other hand, a second air vent 30 can be formed independently from the first air vent 29. These air vents are preferably connected via an air releasing groove 44 formed in a resin sealing mold (see, e.g., description below).

Figure 16:
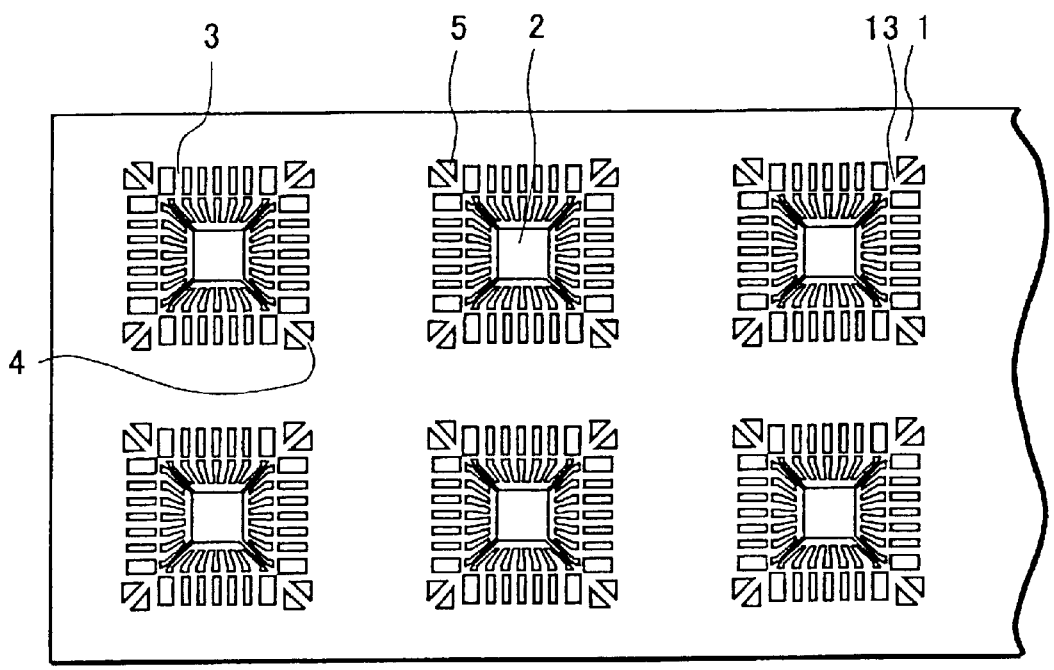
FIG. 16 is a drawing showing a background semiconductor device manufacturing method.
Figure 17:
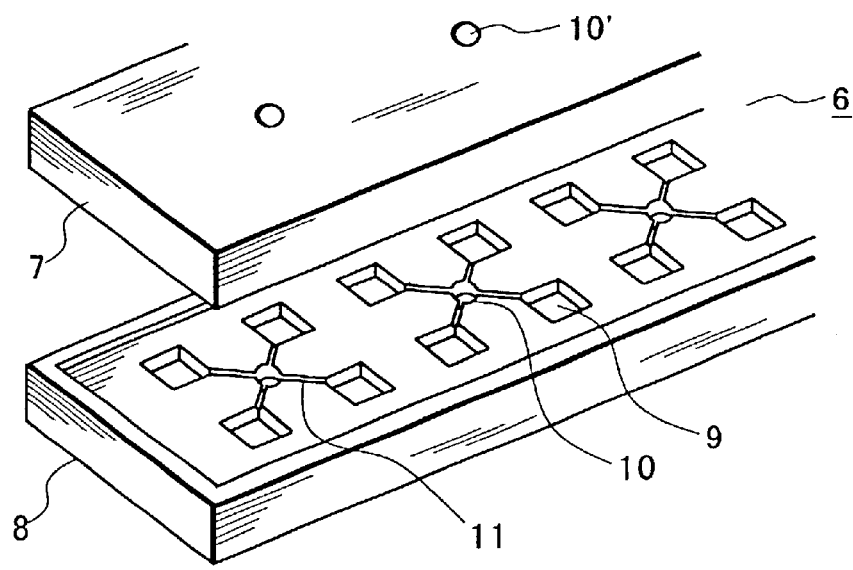
FIG. 17 is a drawing showing a background semiconductor device manufacturing method.
Figure 18:
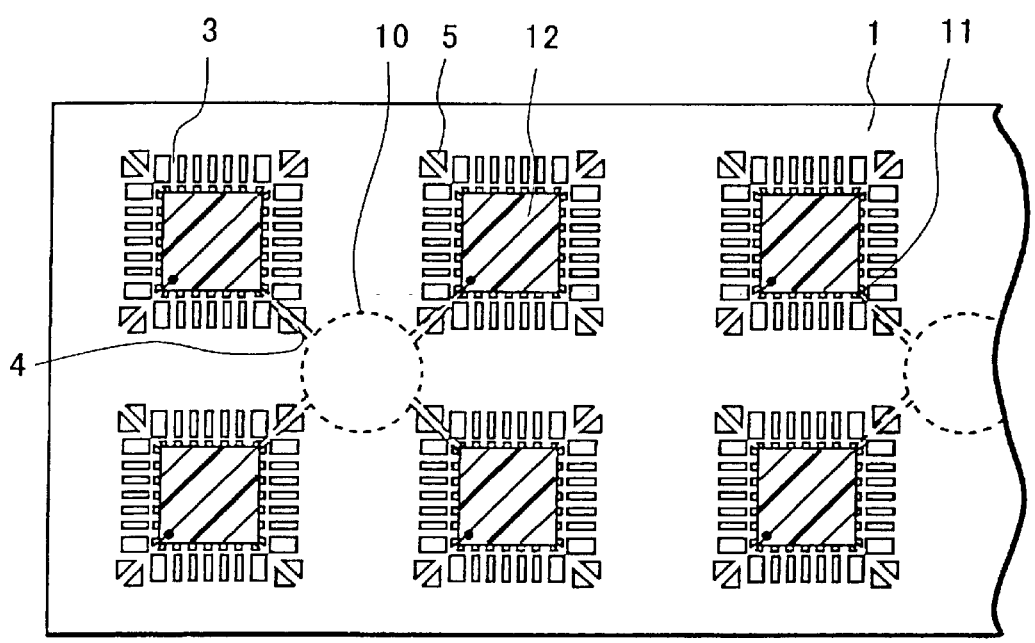
FIG. 18 is a drawing showing a background semiconductor device manufacturing method.

In particular, the second air vent 30 can be provided with the function of the hole 5 (see, e.g., FIG. 16) shown in the background example. The second air vent 30 can be provided so that, for instance, the air in the cavity 46 flows into the second air vent 30 and is released to the outside. However, in the lead frame 21 of the preferred embodiments, it is also desirable that the resin also flows into the second air vent 30. In this case, although the resin may be filled over the entire second air vent 30 in the same manner as the first air vent 29, only at least a region including the connecting portion to the air releasing groove 44 needs to be filled with the resin. This can be in order to, for example, solve at least some of the following problems.

A sealing material forming a package can contain an epoxy resin and a filler as principal materials and minor constituents such as wax and incombustible materials. As in the case with the part 13 of the background lead frame (see, e.g., FIG. 16), it can be difficult to fill the air releasing groove 44 with the filler since it can be narrow, so that the resin strength of this portion after being cured can be low. Furthermore, the air releasing groove 44 may not be sufficiently pressed when molding since the groove is near the second air vent 30, and a low-viscosity porous resin burr in which the epoxy resin and wax have been separated can be created. Therefore, the adhesion of the resin burr at this portion to the lead frame 21 can be low, so that the burr easily adheres to the mold when mold-releasing and easily separates from the lead frame 21.

Therefore, in the lead frame 21 of the preferred embodiments, the first and second air vents 29 and 30 are filled with the resin, and the resin cured inside the air releasing groove 44 and the resin cured inside the first and second air vents 29 and 30 are united. The resin cured inside the air releasing groove 44 easily separates and can be very unstable in a singular state. However, by uniting the above-mentioned three cured resins, they can be securely prevented from separating from the lead frame 21. As a result, during mold-release, the resin cured inside the air releasing groove 44 can be prevented from remaining inside the mold.

By providing the above-mentioned structure, in some embodiments, at least some of the following characteristics can be obtained from the lead frame 21.

As a first characteristic, as shown in FIGS. 3(A)–3(C), a part HL 1 of the first air vent 29 provided in the lead frame 21 can be included in a package, whereby air existing in the cavity 46 can be securely released to the outside of the cavity 46 when resin-sealing. For example, the thickness 29A of the lead frame 21 can be, for example, about 100 to 200 μm, so that the air and resin in the cavity 46 can be extracted to the outside from the first air vent 29 having this thickness. Thereby, resin unfilled regions at the corner of the package can be eliminated. This is because, for example, the unfilled regions concentrate at the HL 2 side of the first air vent 29 even when the air remains.

As a second characteristic, since the resin directly flows into the first air vent 29 from the cavity 46, the cured resin in the first air vent 29 can be integrated with the package 47 while having the thickness of the lead frame 21. For example, even when the package 47 is released from the mold, the resin in the first air vent 29 can be released from the mold integrally with the package 47 and lead frame 21 while having a thickness several times the thickness of conventional burrs, and does not remain in the mold. As a result, a lead frame can be achieved in which the resin is prevented from flowing out from the cavity 46 and staining the inside of the mold.

As a third characteristic, the first air vent 29 and the second air vent 30 can be formed independently from each other. Additionally, the second air vent 30 can be provided with the role of the background air vent. For example, an air releasing groove 44 (see FIGS. 4(A)–4(B)) which connects the first air vent 29 and the second air vent 30 can be provided in a resin sealing mold (such as, e.g., described later), and the air existing in the cavity 46 can be released from the second air vent 30. Then, the first air vent 29 can be formed as far as possible from the end of the cavity 46 SO that L>W as shown in FIG. 3(A). Thereby, even if the resin remains in the air releasing groove 44 and closes the first air vent 29 and the second air vent 30, the air in the cavity 46 can stay at the end HL 2 of the first air vent 29. As a result, resin unfilled regions can be eliminated from the package. Herein, W shows the width of the first air vent 29, and L shows the length in the extension direction of the first air vent 29.

In the presently illustrated embodiment, the first air vent 29 is shaped generally into a "T"-shape. However, the shape is not limited and may be another appropriate shape, such as, for example, a circle or a quadrilateral. A parallel effect as in the case of a "T" shaped vent can be obtained if a part of the first air vent is included in the cavity that is shown by the alternate long and short dashed line in FIGS. 3(A)–3(C). Additionally, various other changes can be made without departing from the spirit of the invention.

Next, a preferred resin sealing mold will be described with reference to FIGS. 4(A)–10. First, a first embodiment will be described with reference to FIGS. 4(A)–6. Here, FIG. 4(A) is a plan view showing the interior of an upper mold, and FIG. 4(B) is a sectional view of an air vent forming region when resin-molding.

Figure 4A:
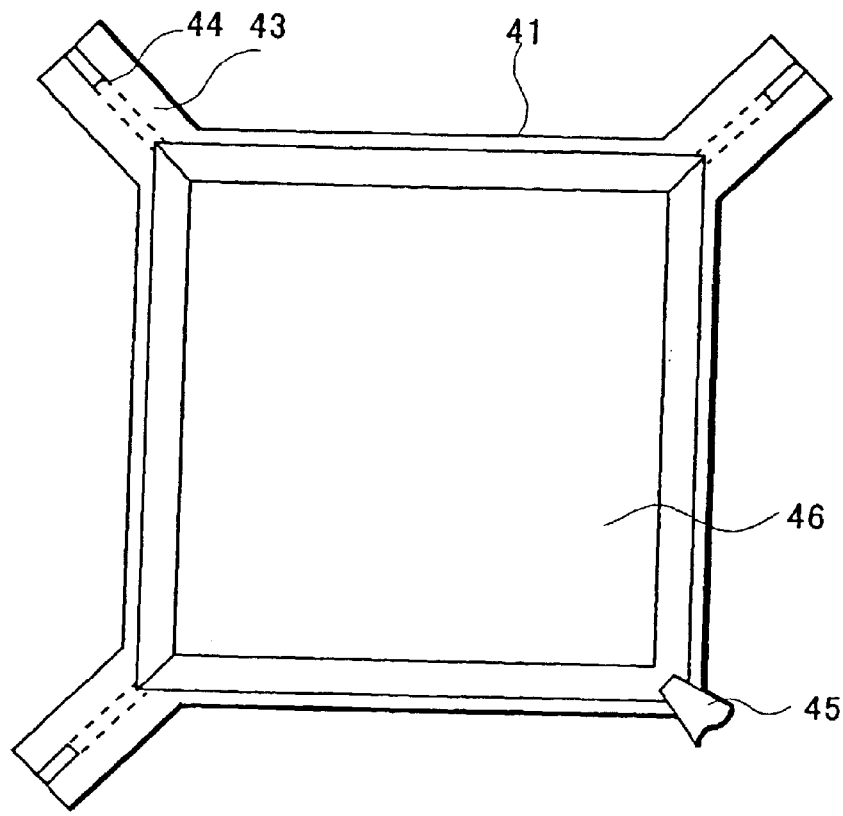
FIGS. 4(A)–4(B) are drawings describing a resin sealing mold of a first embodiment of the invention.
Figure 4B:
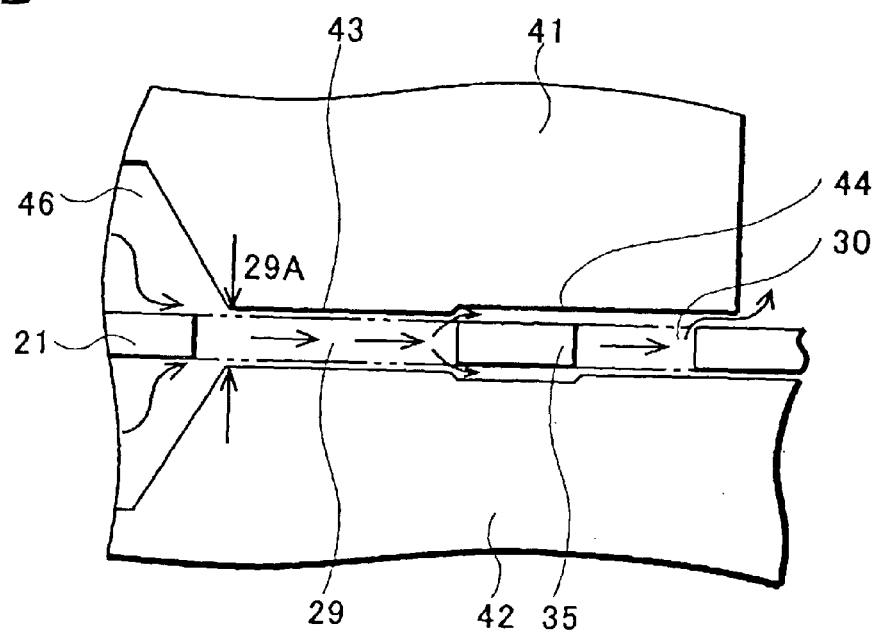

As shown in FIG. 4(A), at three corners of the cavity 46 of the upper mold 41, contact surfaces 43 can be formed in accordance with the air vent forming regions 32 shown in FIG. 2. These contact surfaces 43 can have a function for supporting the lead frame 21 inside the cavity 46 when being fitted with the lower mold 42. Furthermore, the contact surfaces 43 can have a function for connecting the first and second air vents 29 and 30 formed in the lead frame 21 via an air releasing groove 44. Preferably, an air releasing groove 44 is formed at the contact surface 43 of the upper mold 41 to connect the first and second air vents 29 and 30. As shown in FIG. 4(B), this air releasing groove 44 is preferably positioned so as to cover a part 35 of the lead frame 21 which separates the first air vent 29 and the second air vent 30. The depth of the air releasing groove 44 can be formed to, for example, about 10 to 50 μm from the contact surface 43. The length of the air releasing groove 44 can be set so as to slightly overlap the first air vent 29 and the second air vent 30 to connect them.

As shown in the figure, air releasing grooves for connecting the first and second air vents 29 and 30 can also be formed in the lower mold 42 in advance in the same manner as the upper mold 41. Furthermore, as shown in the figure, in the upper mold 41, the air releasing groove 44 may be formed so as to cover the entirety of the second air vent 30 or continuously formed from the cavity 46 as shown by the dotted lines. In this case, the width of the air releasing grooves 44 can be almost equal to that of the first air vent 29, and the air releasing grooves 44 can be positioned at the contact surfaces 43 over and under the first air vent 29. Thereby, as mentioned above, a burr created due to the air releasing groove 44 can be cured integrally with the resin inside the first and second air vents 29 and 30. As a result, in contrast to the background example, the burr created due to the air releasing groove 44 can be prevented from becoming a resin burr continued to the package 47 of about 30 to 50 μm.

Next, with reference to FIG. 4(B), the air flow inside the cavity 46, particularly the air flow at the corner of the cavity 46 having the contact surfaces 43 at which the first and second air vents 29 and 30 are formed will be described. As shown in the figure, when resin-molding, the air and resin led to a corner inside the cavity 46 flow into the first air vent 29. At this point, since the thickness of the lead frame 21 can be, for example, about 100 to 250 μm, the width of the first air vent 29 can also be, for example, about 100 to 250 μm. Therefore, not only the air but also the resin in the cavity 46 flows into the first air vent 29. Inside the first air vent 29, the air collects near the HL 2, and then flows into the second air vent 30 via the air releasing groove 44 provided in the upper mold 41 or the lower mold 42. At this point, the air releasing groove 44 can be formed so as to have a width of, for example, about 30 to 50 μm. Therefore, the problem explained in the description of the lead frame 21 occurs, however, as mentioned above, this problem can be solved. As shown in the figure, the side surfaces of the molds 41 and 42 can be inclined to enhance mold-releasing performance, and the cavity can be substantially formed as, e.g., a hexahedron.

Figure 5:
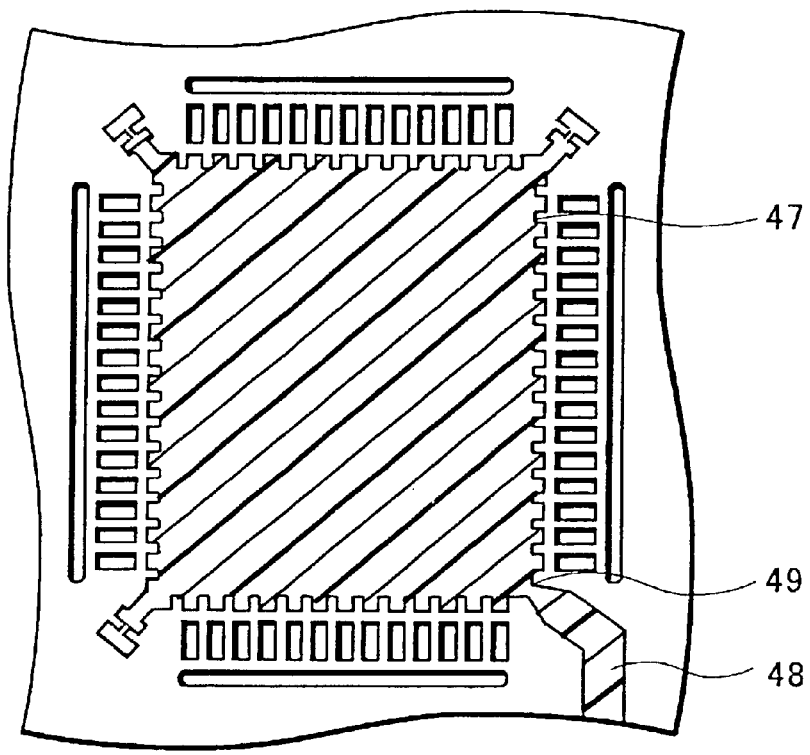
FIG. 5 is a drawing describing a package formed by using the resin sealing mold of the first embodiment of the invention.
Figure 6:
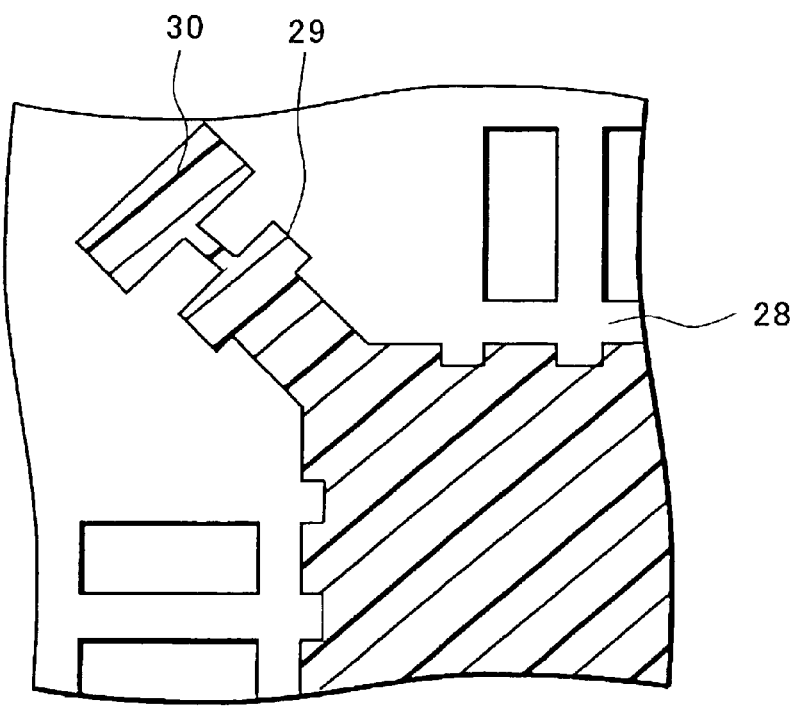
FIG. 6 is a drawing describing the package formed by using the resin sealing mold of the first embodiment of the invention.

By using the above-mentioned resin sealing mold, as shown in FIGS. 5 and 6, a package 47 can be formed for each mounting portion 24 so as to cover the lead frame 21. Here, FIG. 5 is a plan view showing one of the mounting portions 24 on the lead frame 21 in an enlarged manner, and FIG. 6 is a plan view showing the first and second air vents 29 and 30 of the mounting portion 24 of FIG. 5. Namely, as shown in FIG. 6, by using a resin sealing mold as per preferred embodiments herein, the resin that flows out from the cavity 46 can be cured at least at a part of the first air vent 29, the air releasing groove 44, and the second air vent 30.

Accordingly, as mentioned above, when releasing the package from the mold, the cured resin can be released from the mold integrally with the resin package 47 and the lead frame 21. Then, the air in the cavity 46 can release to the outside from the second air vent 30 via the air releasing groove 44, such as shown by the arrows in FIG. 4(B).

In preferred embodiments, by providing two air vents 29 and 30 in the lead frame 21, a resin sealing mold can be realized in which the air in the cavity 46 can be discharged to the outside of the original package region, and furthermore, the resin can hardly stain the mold portions corresponding to the air releasing groove 44.

Figure 7A:
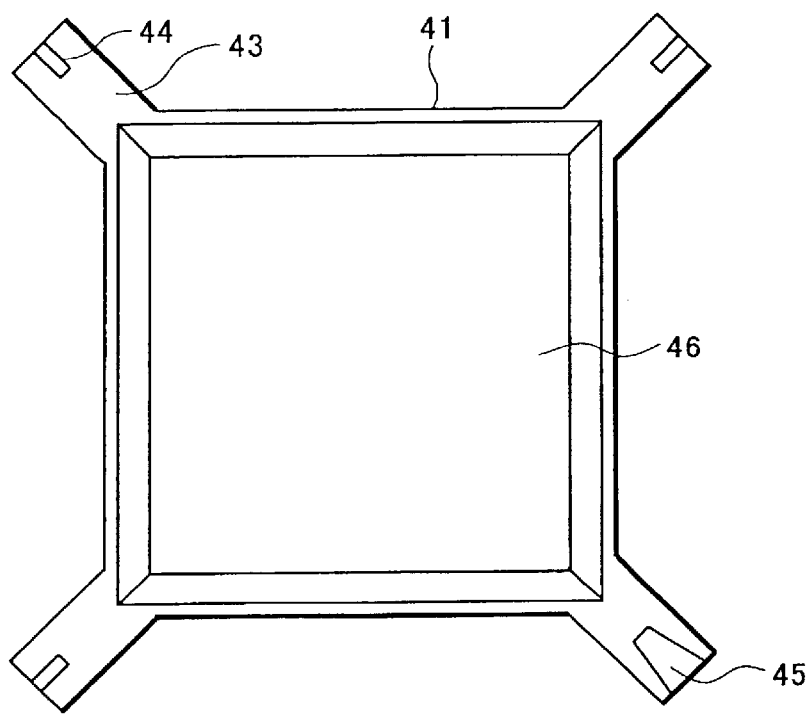
FIGS. 7(A)–7(B) are drawings describing a resin sealing mold of a second embodiment of the invention.
Figure 7B:
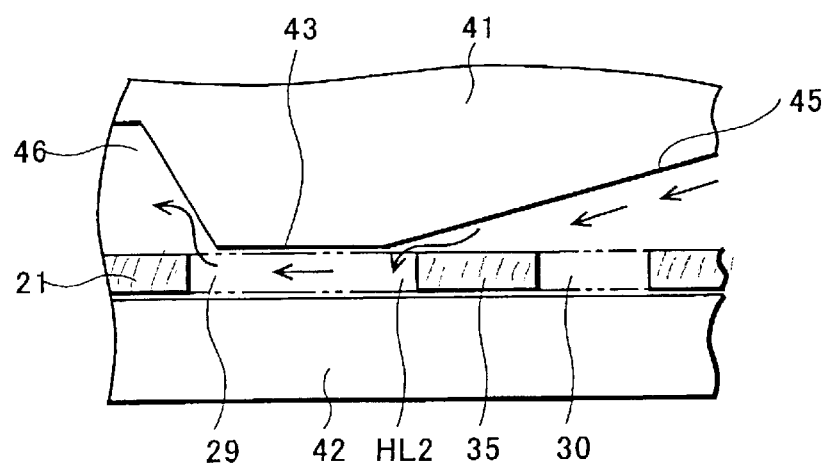

Next, a second embodiment will be described with reference to FIGS. 7(A)–9. Here, FIG. 7(A) is a plan view of the interior of the upper mold, and FIG. 7(B) is a sectional view of the air vent forming region when resin-molding. Parallel components to that in the first embodiment are labeled with like symbols.

Figure 8:
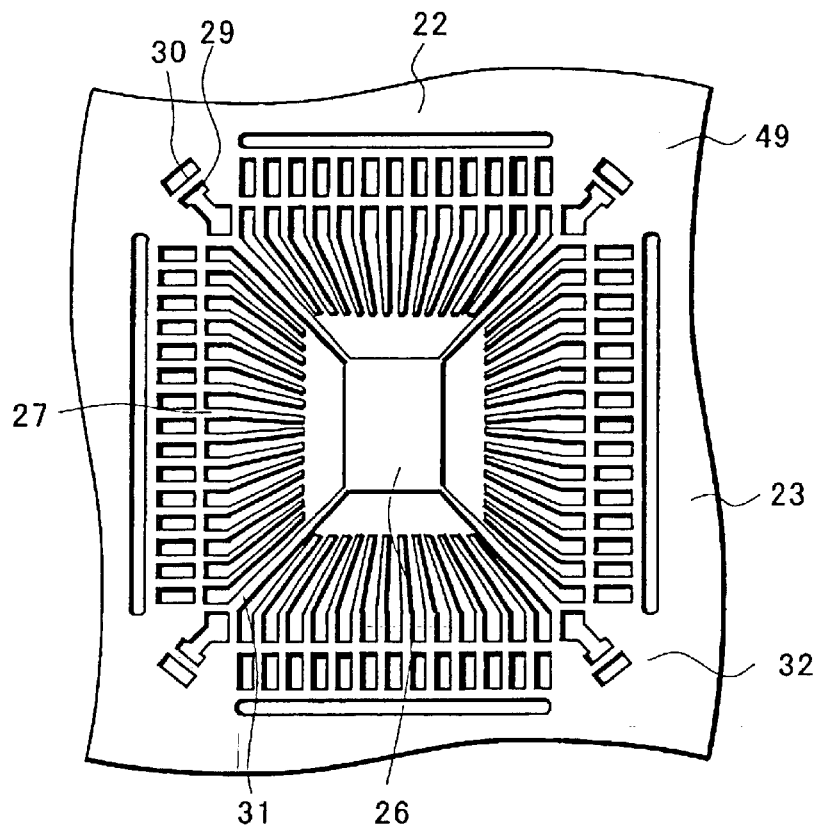
FIG. 8 is a drawing describing a lead frame to be used for the resin sealing mold of the second embodiment of the invention.

First, in the second embodiment, as shown in FIG. 8, a lead frame 49 can be used in which the first and second air vents 29 and 30 can also be formed in the air vent forming region 32 corresponding to the resin injection gate 45. As shown in FIG. 7(A), preferably, at all four corners of the cavity 46 of the upper mold 41, contact surfaces 43 are formed in accordance with the air vent forming regions 32 shown in FIG. 8. The contact surfaces 43 preferably have a function of supporting the lead frame 49 inside the cavity 46 when being fitted with the lower mold 42. Furthermore, the contact surfaces preferably have a function of connecting the first and second air vents 29 and 30 formed in the lead frame 49 by the air releasing groove 44. This structure can be like that in the first embodiment. Accordingly, reference is made to the description of the first embodiment.

Figure 9:
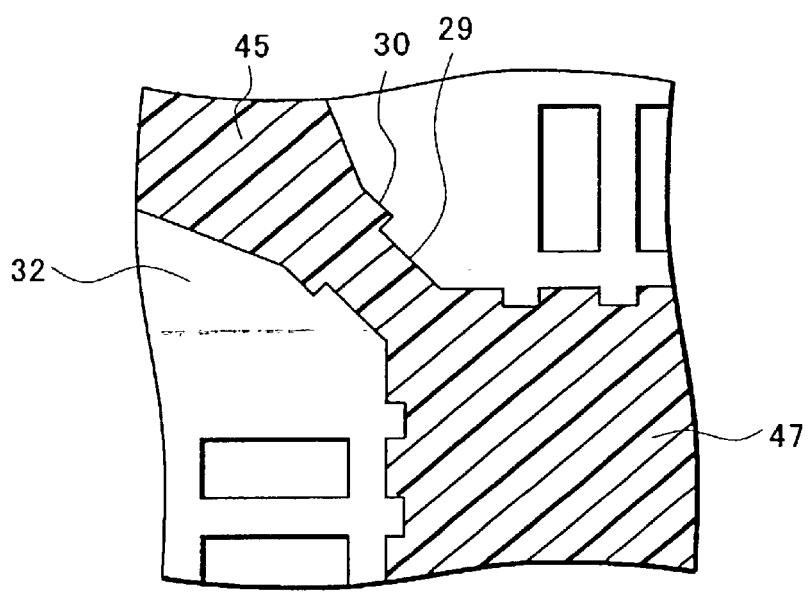
FIG. 9 is a drawing describing a package formed by using the resin sealing mold of the second embodiment of the invention.

The second embodiment preferably includes that the tip end of the resin injection gate 45 is not formed to be continued to the cavity 46, but is formed to be positioned at the contact surface 43 separated from the cavity 46. As shown in FIG. 7(B), the gate 45 provided in the upper mold 41 is preferably not formed to be directly continued to the cavity 46, but is preferably formed so that the tip end of the gate is positioned at the HL 2 side of the first air vent 29. Thereby, as shown by the arrows, the resin that flows in from the gate 45 flows into the cavity 46 through the first air vent 29. In the same manner as other corners, also at the gate 45, the contact surface 43 of the upper mold 41 can be positioned at the upper surface of the first air vent 29. As a result, as shown in FIG. 9, also at the gate 45, a structure can be achieved in which creation of resin burrs can be prevented on the region 32 in which the first and second air vents 29 and 30 are formed.

Preferably, the first air vent 29 is used for not only releasing air but also for injecting the resin at the gate 45, whereby creation of resin burrs in the region continued to the package 47 can be prevented. Particularly, creation of resin burrs at the four corners of the package 47 can be prevented. Thereby, as in the case with a QFN type semiconductor device, an excellent effect can be obtained, for instance, in the case of a back surface mounting type in which even a slight amount of dust such as resin burrs could easily cause a mounting failure. While a structure where first and second air vents are formed has been described, in this second embodiment, it is not necessary to limit the structure to this example. For instance, a similar effect can be obtained under a condition where at least the first air vent is provided.

Figure 10A:
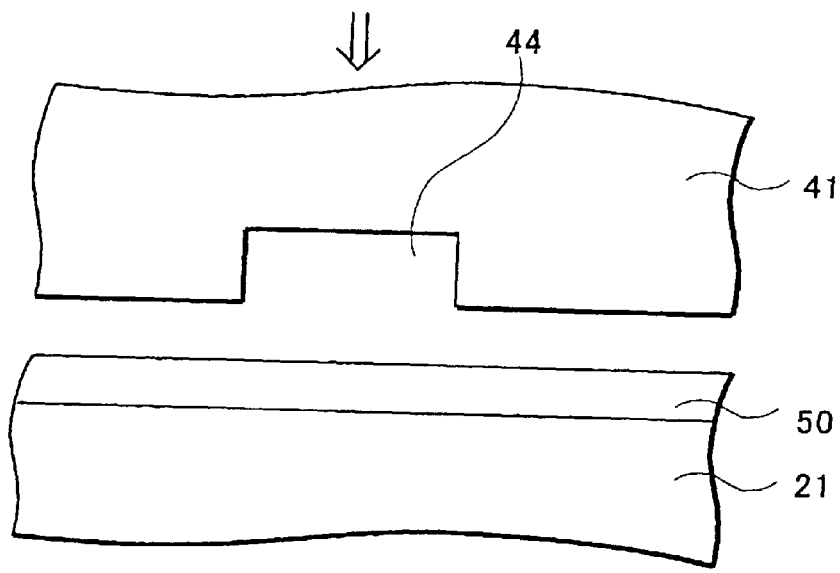
FIGS. 10(A)–10(B) are drawings describing a semiconductor device manufacturing method according to some embodiments of the invention.
Figure 10B:
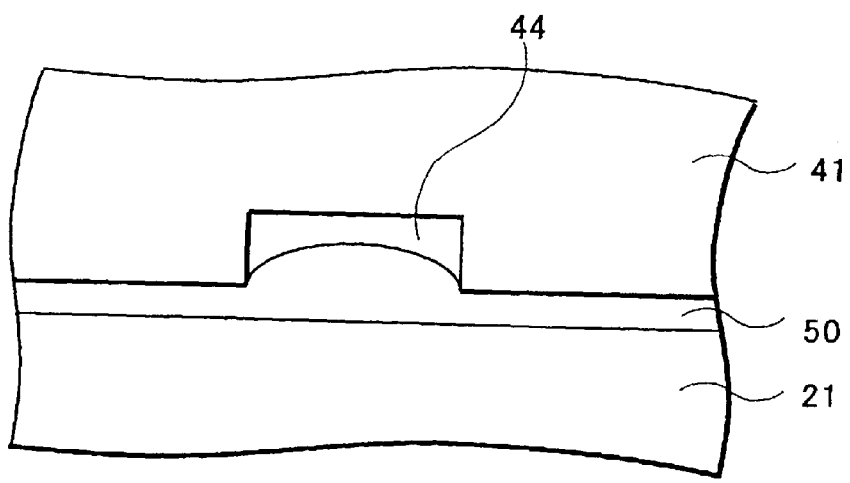

Furthermore, in the above-mentioned first and second embodiments, as shown in FIGS. 10(A)–10(B), in a case where a lead frame 21 on which a plating film 50 had been formed in advance was used, particularly, when the plating film 50 was as thick as, for example, about 20 to 30 μm, the following problems have been found to potentially occur.

When resin-molding, the lead frame 213 is pressed by the mold 41, and at this point, the plating film 50 on the surface in contact with the mold 41 can be squashed by the pressure of the mold 41, and the plating film 50 in the air releasing groove 44 protrudes. This makes the groove of approximately 30 to 50 μm narrower, and an unfilled region is easily created in the cavity 46. However, in the resin sealing mold of the preferred embodiments, by a combination with the above-mentioned lead frame, at least an air flowing path having about the same thickness as that of the lead frame 21 can be reliably secured. Therefore, substantially no unfilled region is formed at the ends of the package 47.

Last, with reference to FIGS. 1–15(A), preferred methods for manufacturing a semiconductor device using the above-mentioned lead frame and resin sealing mold are now described. Herein, common drawings and common symbols that were used in the above-mentioned descriptions of the lead frame and the resin sealing mold shall also be used in the description of the following embodiments.

Figure 11A:
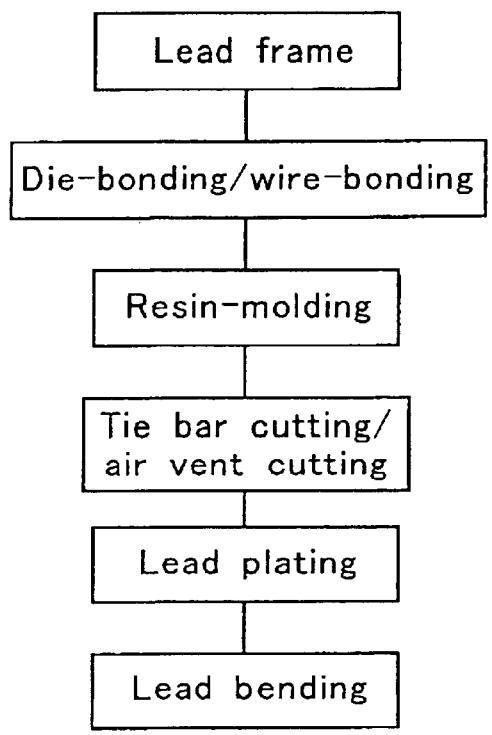
FIGS. 11(A)–11(B) are drawings describing a semiconductor device manufacturing method according to some embodiments of the invention.
Figure 11B:
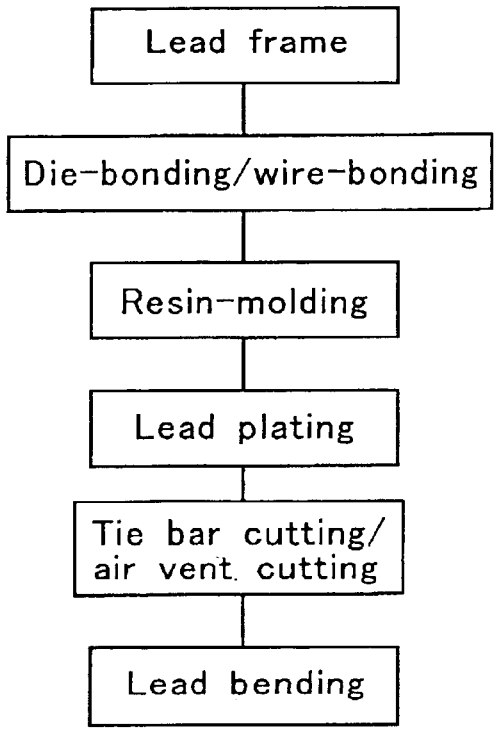

As shown in FIG. 11(A), a semiconductor device manufacturing method can include at least some, and preferably all, of the processes of preparing a lead frame, die-bonding and wire-bonding, resin-molding, tie bar cutting and air vent cutting, lead plating, and lead bending. As shown in FIG. 11(B), a semiconductor device manufacturing method can also include at least some, and preferably all, of the processes of preparing a lead frame, die-bonding and wire-bonding, resin-molding, lead plating, tie bar cutting and air vent cutting, and lead bending. In the most preferred embodiments, advantageously, the tie bar cutting and air vent cutting processes are simultaneously carried out.

Hereinafter, an illustrative manufacturing method according to that shown in FIG. 11(B) will be described.

The first process preferably includes, as shown in FIG. 1, preparation of a lead frame. The semiconductor device manufacturing method of this present embodiment preferably uses the lead frame that has been described above with reference to FIGS. 1–3(C). Therefore, reference is made to the above description of the lead frame 21.

Figure 12:
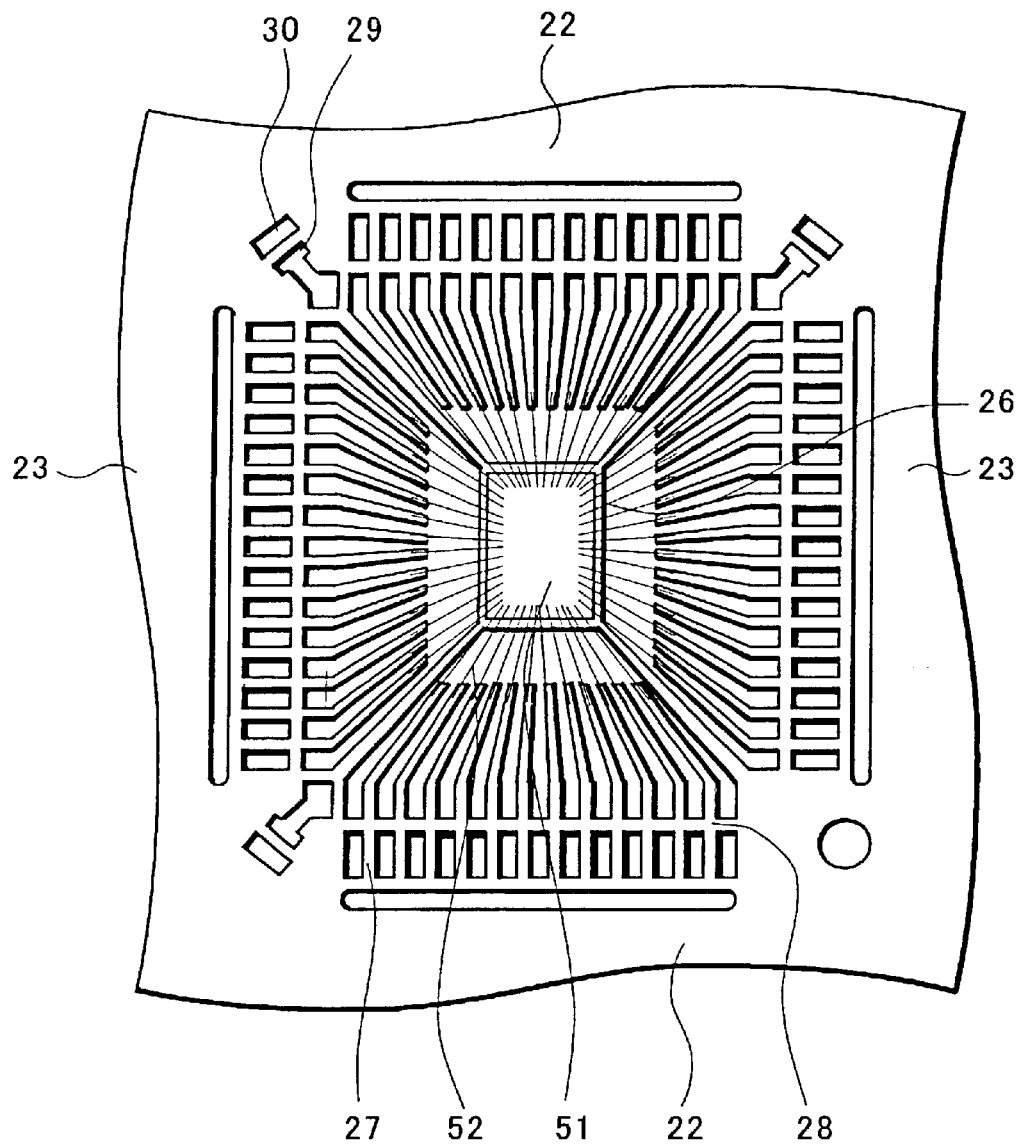
FIG. 12 is a drawing describing a semiconductor device manufacturing method according to some embodiments of the invention.

The second process preferably includes, as shown in FIG. 12, a process for die-bonding a semiconductor element 51 on the island 26 of the lead frame 21 and for wire-bonding the bonding pad of the semiconductor element 51 and the leads 27 of the lead frame 21 by thin metallic wires 52 to connect them.

In this process, for each mounting portion 24 of the lead frame 21, a semiconductor element 51 is preferably die-bonded and fixed to the surface of the island 26 by a conductive paste, such as for example an Ag paste. Additionally, thin metallic wires, such as for example Au wires, can be used. In this case, ultrasonic thermocompression bonding is preferably used for the thin metallic wires 52, ball bonding is preferably used for the bonding pad portion, and stitchbonding is preferably used for the lead 27 side. In some cases, silver plating or gilding can be applied to the leads 27 in view of adhesion to the conductive paste (not shown). Further, as an adhesion means for the semiconductor element 51, an adhesive agent or film made of an Au—Si foil, a brazing material such as solder, or an insulating material can be used depending on the purpose of use.

Figure 13:
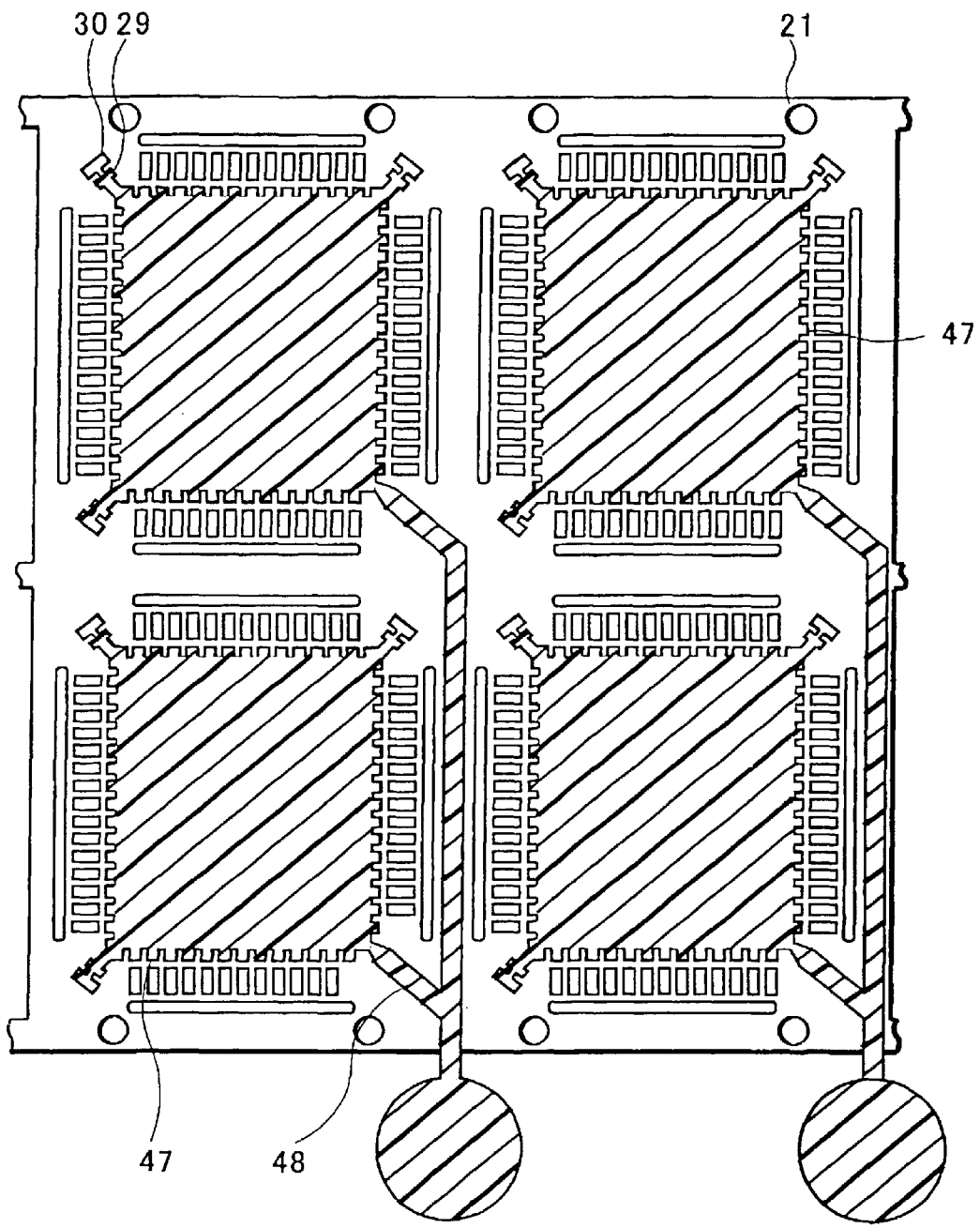
FIG. 13 is a drawing describing a semiconductor device manufacturing method according to some embodiments of the invention.

The third process preferably includes a process for resin-molding the lead frame by using a resin sealing mold. This process preferably includes that the lead frame 21 described above with reference to FIGS. 1–3(C) is used, and that the resin sealing mold described above with reference to FIGS. 4(A)–6 is further used for resin-molding. After the lead frame 21 is released from the mold, as shown in FIG. 13, the resin can be cured at the portions of the package 47 and the runner 48 on the lead frame 21. This process can be appreciated with reference to the above descriptions of FIGS. 1–6.

Furthermore, in the description of the semiconductor device manufacturing method of the present preferred embodiment, a lead mounting type that is, e.g., a QFP type semiconductor device has been described. However, in the case of a back surface mounting type that is a QFN type semiconductor device, the resin-molding process described with reference to FIGS. 7–9 can be superior. This case can be appreciated with reference to the descriptions of FIGS. 7(A)–9.

The fourth process preferably includes a process for plating the leads 27 exposed from the package 47. In this process, in view of lead oxidation prevention and solder wetability, plating is preferably applied to the leads 27. At this point, plating is preferably applied to the entire lead frame 21 on which a plurality of mounting portions 24 have been formed. For example, cathode electrodes are preferably prepared at the side of the lead frames 21 or a plating auxiliary rack on which the lead frames are placed and anode electrodes are preferably prepared at a plating bath side. Preferably, plating is applied to a plurality of lead frames 21 all at once. In this case, plating solutions such as Pd, Sn, Ni, Sn—Pb, Sn—Bi, Sn—Ag, Sn—Cu, Au—Ag, and Sn—Ag—Cu can be prepared, and by a combination of these plating solutions, at least one layer of plating film can be applied on the leads 27. In the case where Pd plating is used for the lead frame 21, a lead frame 21 on which the Pd plating has been applied before resin-molding is preferably used. The same applies to other cases in which a lead frame 21 applied with plating in advance is used.

Figure 14:
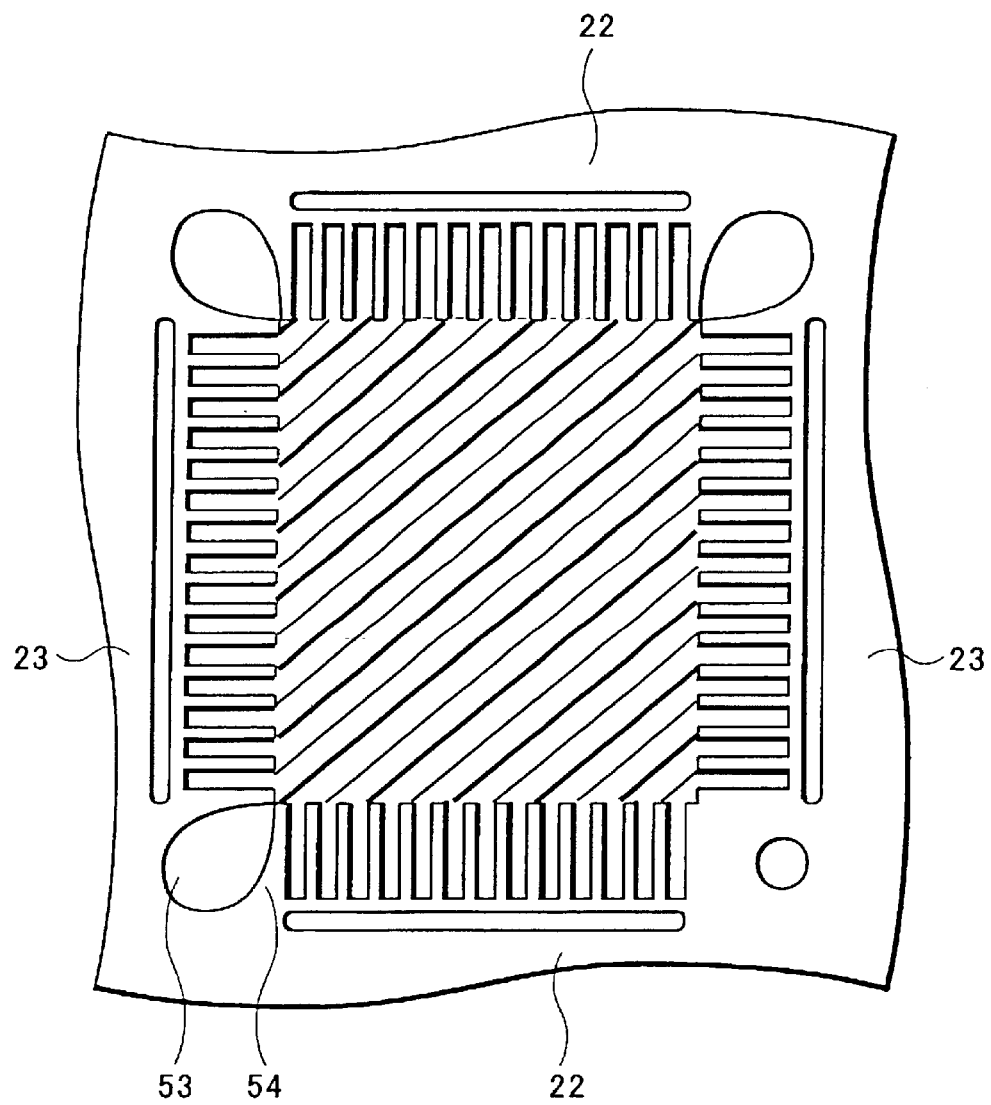
FIG. 14 is a drawing describing a semiconductor device manufacturing method according to some embodiments of the invention.

The fifth process preferably includes a process for cutting the tie bars integrally supporting the leads 27 and, at the same time, eliminating the first and second air vents 29 and 30 as shown in FIG. 14.

In this process, the tie bars 28 integrally supporting the leads 27 can be stamped out to make the leads 27 independent from each other. Preferably, the first and second air vents 29 and 30 are simultaneously stamped out. As mentioned above, in the semiconductor device manufacturing method of the preferred embodiments, the resin that flows out from the cavity 46 can be cured inside the first air vent 29. Therefore, substantially no thin resin burrs continued to the package 47 are created on the lead frame 21. Furthermore, since the lead frame 21 preferably has a thickness of about 100 to 250 μm, the resin can be integrally cured inside the first air vent 29, the air releasing groove 44, and the second air vent 30. That is, resin burrs can be formed at predetermined positions. As a result, when stamping out the first and second air vents 29 and 30, all resin burrs can be removed together with the lead frame 21. Thus, resin burrs can be prevented from remaining in the next process of lead bending.

When stamping out the tie bars 28, the resin burrs formed between the leads 27 can also be removed. At this point, as shown in the figure, the first and second air vents 29 and 30 can be stamped out into shapes 53 having, for example, curves, and further, they may be stamped out to be other shapes such as, for example, circular or quadrilateral shapes. A part 54 of the lead frame 21 is preferably left and connected to the first and second connected line bodies 22 and 23, whereby the mounting portion 24 is preferably not separated from the lead frame 21.

Figure 15A:
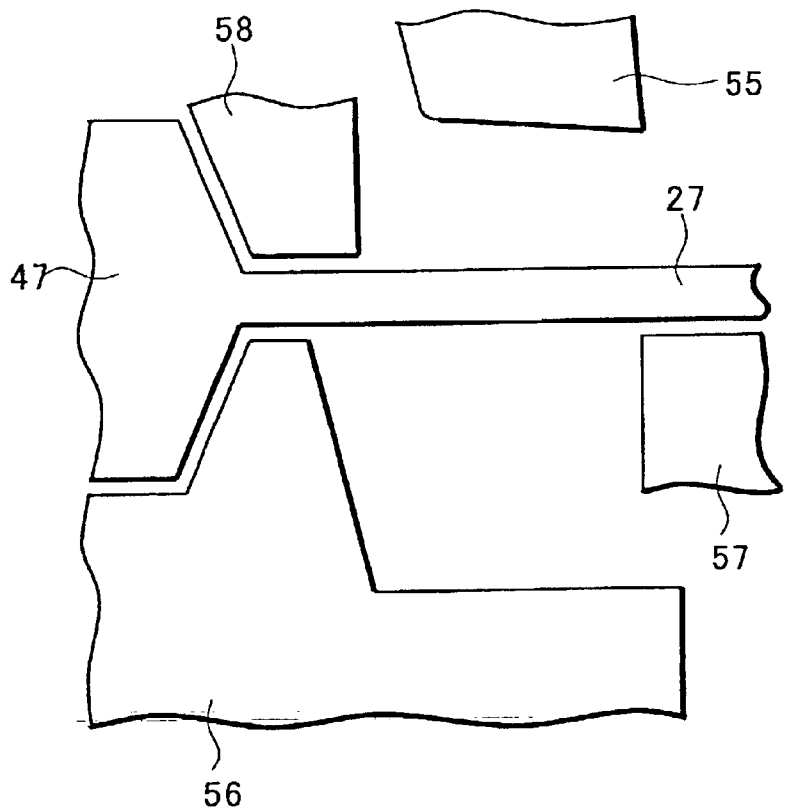
FIGS. 15(A)–15(B) are drawings describing a semiconductor device manufacturing method according to some embodiments of the invention.
Figure 15B:
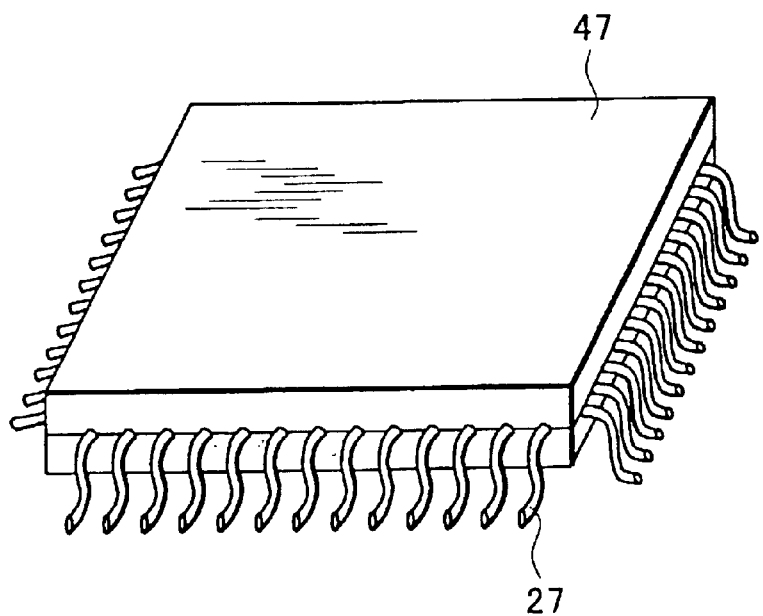

The sixth process preferably includes, as shown in FIGS. 15(A)–15(B), a process for bending the leads, and preferably at the same time, separating the individual semiconductor devices from the lead frame 21.

Preferably, in this process, first, the lead 27 applied with plating is set on seats 56 and 57, and the package 47 and the lead 27 of the semiconductor device are preferably fixed by the seat 56 and a lead supporting means 58. At this point, the tip end of the lead 27 is preferably set on the seat 57. Then, the lead 27 can be cut by, e.g., a punch 55 and the other portion can be bent. However, in this process, since resin burrs outside the package 47 have all preferably been removed in the previous process, substantially no resin burrs crushed due to an impact in this work exist on the seat 56. Therefore, in this lead bending process, a phenomenon in which dents or molding failures occur on the lead 27 due to crushed resin burrs is suppressed. As a result, as shown in FIG. 15(B), a semiconductor device with excellent quality can be completed which includes substantially no unfilled region in the package 47 and substantially no dents or molding failures at the lead 27. For example, in the case of a lead frame that is as thin as about 100 $\mu$m or less or a fine-pitch lead of, for example, about 500 $\mu$m or less, the above-mentioned effects can be obtained.

As mentioned above, the semiconductor device manufacturing method of the preferred embodiments preferably includes that tie bar cutting and air vent cutting are simultaneously carried out. Thereby, tie bar cutting and lead bending can preferably be continuously carried out. As a result, among other possible advantages which may be obtained, work time can be shortened and/or capital investment can preferably be reduced.

In this present embodiment, the semiconductor device manufacturing method shown in FIG. 11(B) has been described. However, parallel effects can be obtained by, e.g., the semiconductor device manufacturing method shown in FIG. 11(A). In this latter case of FIG. 11(A), plating can be carried out between the tie bar cutting and air vent cutting and the lead bending, so that lead bending can be carried out in a condition where resin burrs are more securely removed. Various other changes are possible without departing from the spirit of the invention.

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited.

What is claimed is:

1. A lead frame, comprising:
   at least one island;
   a pair of first connected line bodies and a pair of second connected line bodies which are disposed so as to surround said island;
   a plurality of leads extending from said first and second connected line bodies to the vicinity of the island;
   tie bars which integrate said leads and are disposed so as to surround the island; and
   air vent disposing regions formed in the vicinities of regions in which the first and second connected line bodies intersect;
   wherein at least in a first of said air vent disposing regions, a first air vent penetrating a lead forming region between said first air vent disposing region and the island and a second air vent that is formed independently in the vicinity of this first air vent are provided.

2. The lead frame according to claim 1, wherein said first air vent disposing region is formed integrally with two of said tie bars in the vicinity of an intersection of these two tie bars.

3. The lead frame according to claim 1, wherein an extending length L of said first air vent is longer than a width W, and the first air vent is configured as a resin burr creating region.

4. The lead frame according to claim 1, wherein a part of said first air vent is included in a resin sealed body forming region.

5. The lead frame according to claim 1, wherein said second air vent is located more outwardly than said first air vent based on said island and the first air vent and the second air vent communicate via an air releasing groove formed in a mold.

6. The lead frame according to claim 1, wherein said second air vent has a hole for releasing air to the outside.

7. The lead frame according to claim 4, wherein said second air vent has a hole for releasing air to the outside.

8. The lead frame according to claim 5, wherein said second air vent has a hole for releasing air to the outside.

9. A method for manufacturing a semiconductor device, comprising:
   preparing a lead frame having at least tie bars for integrally supporting a plurality or leads and first air vents and second air vents, and on which semiconductor elements are mounted;
   housing said lead frame in a resin sealing mold that includes an upper mold and a lower mold and has a substantially hexahedral cavity and four corners of said hexahedron formed at a surface of contact between the upper mold and lower mold via the lead frame, and air releasing grooves at the contact surfaces of at least the upper mold or lower mold from a plurality of said corners; and
   leading air in the cavity through the first air vents, the air releasing grooves and the second air vents, and filling a resin in the cavity, whereby a resin sealed body is formed.

10. The method for manufacturing a semiconductor device according to claim 9, wherein said first and second air vents are formed in the lead frame in the vicinities of a plurality or the four corners, and the first air vents and the second air vents are connected via the air releasing grooves.

11. The method for manufacturing a semiconductor device according to claim 9, wherein a part of the first air vents is connected to the inside of the cavity, and at least the inside or the first air vents is filled with a resin.

12. The method for manufacturing a semiconductor device according to claim 10, wherein a part of the first air vents is connected to the inside of the cavity, and at least the inside of the first air vents is filled with a resin.

13. The method for manufacturing a semiconductor device according to claim 9, wherein, after releasing the lead frame from the mold, at least the resin in the first air vents remains in the first air vents, and in the tie bar cutting process, the first and second air vents are simultaneously eliminated.

14. The method for manufacturing a semiconductor device according to claim 10, wherein, after releasing the lead frame from the mold, at least the resin in the first air vents remains in the first air vents, and in the tie bar cutting process, the first and second air vents are simultaneously eliminated.

15. The method for manufacturing a semiconductor device according to claim 11, wherein, after releasing the lead frame from the mold, at least the resin in the first air vents remains in the first air vents, and in the tie bar cutting process, the first and second air vents are simultaneously eliminated.

16. The method for manufacturing a semiconductor device according to claim 12, wherein, after releasing the lead frame from the mold, at least the resin in the first air vents remains in the first air vents, and in the tie bar cutting process, the first and second air vents are simultaneously eliminated.

17. The method for manufacturing a semiconductor device according to claim 9, wherein, after releasing the lead frame from the mold, the tie bar cutting process and a process for bending the leads into a desired shape are continuously carried out.

18. The method for manufacturing a semiconductor device according to claim 17, wherein at least one plating layer is formed on the leads.

19. The method for manufacturing a semiconductor device according to claim 18, wherein said plating layer is made from a combination selected from the group consisting of Pd, Sn, Sn—Pb, Sn—Bi, Sn—Ag, Sn—Cu, Au—Ag, and Sn—Ag—Cu.

20. The method for manufacturing a semiconductor device according to claim 9, wherein a resin injection gate is formed at least at one of the corners, one end of said resin injection gate positioned at the cavity side is positioned at the contact surface separated from the cavity, said one end of the resin injection gate and a first said first air vent is continued to each other, and the resin is filled in the cavity from the first air vent.

21. The method for manufacturing a semiconductor device according to claim 9, wherein a resin injection gate is formed at least at one of the corners, the resin injection gate is positioned at a cavity side, and ends of the air releasing grooves are positioned at the contact surface separated from the cavity, one end of the resin injection gate and a first said first air vent are continued to each other, the resin is filled in the cavity through the first air vent, and the air is released from the cavity through the first air vent.

\* \* \* \* \*